United States Patent
Jeddeloh

(10) Patent No.: US 8,510,480 B2
(45) Date of Patent: *Aug. 13, 2013

(54) MEMORY SYSTEM AND METHOD HAVING UNI-DIRECTIONAL DATA BUSES

(75) Inventor: Joseph M. Jeddeloh, Shoreview, MN (US)

(73) Assignee: Round Rock Research, LLC, Mt. Kisco, NY (US)

( * ) Notice: Subject to any disclaimer, the term of this patent is extended or adjusted under 35 U.S.C. 154(b) by 1742 days.

This patent is subject to a terminal disclaimer.

(21) Appl. No.: 11/594,355

(22) Filed: Nov. 6, 2006

(65) Prior Publication Data

US 2007/0055814 A1    Mar. 8, 2007

Related U.S. Application Data

(63) Continuation of application No. 10/928,411, filed on Aug. 27, 2004, now Pat. No. 7,200,693.

(51) Int. Cl.
    *G06F 13/28* (2006.01)
(52) U.S. Cl.
    USPC ............ 710/22; 710/27; 710/52; 711/168
(58) Field of Classification Search
    USPC ..... 710/21–23, 26, 27, 29, 52, 300; 711/105, 711/168
    See application file for complete search history.

(56) References Cited

U.S. PATENT DOCUMENTS

| | | | |
|---|---|---|---|
| 4,208,715 A | 6/1980 | Kumahara et al. | 364/200 |
| 4,503,497 A | 3/1985 | Krygowski et al. | 364/200 |
| 4,831,522 A | 5/1989 | Henderson et al. | 364/200 |
| 4,954,992 A | 9/1990 | Kumanoya et al. | 365/207 |
| 5,003,485 A | 3/1991 | Francisco | 364/478 |
| 5,086,388 A | 2/1992 | Matoba et al. | 395/425 |
| 5,202,856 A | 4/1993 | Glider et al. | 365/230.05 |
| 5,278,957 A | 1/1994 | Chan | 395/250 |
| 5,289,431 A | 2/1994 | Konishi | 365/230.03 |
| 5,369,619 A | 11/1994 | Ohba | 365/230.03 |
| 5,375,089 A | 12/1994 | Lo | 365/189.04 |
| 5,384,745 A | 1/1995 | Konishi et al. | 365/230.03 |
| 5,446,691 A | 8/1995 | North et al. | 365/189.02 |
| 5,517,462 A | 5/1996 | Iwamoto et al. | 365/233 |
| 5,539,691 A | 7/1996 | Kozaru et al. | 365/189.05 |
| 5,597,084 A | 1/1997 | Parasin | 220/4.28 |
| 5,619,471 A | 4/1997 | Nunziata | 365/230.03 |
| 5,745,732 A | 4/1998 | Cherukuri et al. | 395/495 |
| 5,847,998 A | 12/1998 | Van Buskirk | 365/185.33 |
| 5,856,947 A | 1/1999 | Fang | 365/189.01 |

(Continued)

OTHER PUBLICATIONS

Intel Dual Channel DDR Memory Architecture White Paper, Kingston Technology, Sep. 2003.*

(Continued)

*Primary Examiner* — Khanh Dang
(74) *Attorney, Agent, or Firm* — Lerner, David, Littenberg, Krumholz & Mentlik, LLP

(57) ABSTRACT

A memory system and method includes a unidirectional downstream bus coupling write data from a memory controller to several memory devices, and a unidirectional upstream bus coupling read data from the memory devices to the memory controller. The memory devices each include a write buffer for storing the write data until the respective memory device is no longer busy processing read memory requests. The downstream bus may also be used for coupling memory commands and/or row and column addresses from the memory controller to the memory devices.

25 Claims, 3 Drawing Sheets

(56) References Cited

U.S. PATENT DOCUMENTS

| | | | |
|---|---|---|---|
| 5,925,118 | A | 7/1999 | Revilla et al. ................. 710/110 |
| 5,991,223 | A | 11/1999 | Kozaru et al. ............ 365/230.03 |
| 6,038,630 | A | 3/2000 | Foster et al. .................. 710/132 |
| RE36,655 | E | 4/2000 | Kozaru et al. ............ 365/189.05 |
| 6,061,763 | A | 5/2000 | Rubin et al. .................. 711/129 |
| 6,081,458 | A | 6/2000 | Lattimore et al. ....... 365/189.01 |
| 6,084,823 | A | 7/2000 | Suzuki et al. ................. 365/233 |
| 6,091,662 | A | 7/2000 | Mochida ...................... 365/233 |
| 6,144,604 | A | 11/2000 | Haller et al. ................. 365/221 |
| 6,167,475 | A | 12/2000 | Carr .............................. 710/113 |
| 6,195,280 | B1 | 2/2001 | Lattimore et al. .............. 365/63 |
| 6,215,497 | B1 | 4/2001 | Leung .......................... 345/419 |
| 6,219,763 | B1 | 4/2001 | Lentz et al. .................. 711/151 |
| 6,269,413 | B1 | 7/2001 | Sherlock ........................ 710/52 |
| 6,275,432 | B1 | 8/2001 | Hardee ......................... 365/205 |
| 6,278,644 | B1 | 8/2001 | Takasugi ...................... 365/221 |
| 6,282,588 | B1 | 8/2001 | Yamamoto ...................... 710/27 |
| 6,338,108 | B1 * | 1/2002 | Motomura .................... 710/110 |
| 6,351,423 | B2 | 2/2002 | Ooishi .......................... 365/207 |
| 6,396,749 | B2 | 5/2002 | Al-Shamma et al. ......... 365/200 |
| 6,442,646 | B1 | 8/2002 | Tsuruta ......................... 711/109 |
| 6,452,864 | B1 | 9/2002 | Condemi et al. ............. 365/233 |
| 6,510,161 | B2 | 1/2003 | Trevitt et al. ................. 370/412 |
| 6,515,927 | B2 | 2/2003 | Kitamoto et al. ............ 365/205 |
| 6,518,787 | B1 | 2/2003 | Allegrucci et al. ............ 326/38 |
| 6,522,167 | B1 | 2/2003 | Ansari et al. ................... 326/39 |
| 6,587,905 | B1 | 7/2003 | Correale, Jr. et al. ........ 710/107 |
| 6,587,927 | B2 | 7/2003 | Hotta et al. ................... 711/129 |
| 6,618,775 | B1 | 9/2003 | Davis ............................ 710/100 |
| 6,636,444 | B2 | 10/2003 | Uchida et al. ............ 365/189.05 |
| 6,647,485 | B2 | 11/2003 | Nguyen et al. .................. 712/23 |
| 6,662,285 | B1 | 12/2003 | Douglass et al. ............. 711/167 |
| 6,704,238 | B2 | 3/2004 | Izutsu et al. ............. 365/230.03 |
| 6,717,624 | B1 | 4/2004 | Kasai ............................ 348/718 |
| 6,718,439 | B1 | 4/2004 | Jayavant ....................... 711/136 |
| 6,728,157 | B2 | 4/2004 | Yagishita et al. ............. 365/222 |
| 2002/0023191 | A1 | 2/2002 | Fudeyasu ...................... 711/104 |
| 2004/0034753 | A1 | 2/2004 | Jeddeloh | |
| 2004/0044870 | A1 | 3/2004 | Pawlowski ................... 711/169 |
| 2006/0190671 | A1 | 8/2006 | Jeddeloh .......................... 711/5 |
| 2006/0250879 | A1 | 11/2006 | Jeddeloh ................. 365/230.03 |
| 2007/0028027 | A1 | 2/2007 | Janzen et al. ..................... 711/5 |

OTHER PUBLICATIONS

Croucher, Phil, "Meaning Behind Ram RAS and CAS", http://www.kingston.com/tools/umg/umg03.asp, printed Feb. 24, 2006.

Definition of "The Memory Controller", PC Guide, http://www.pcguide.com/ref/ram/timingController-c.html, printed Aug. 2, 2006.

De Gelas, Johan, "Ace's Guide to Memory Technology", Ace's Hardware, Jul. 13, 2000, pp. 1-6, http://www.aceshardware.com/read.isp?id=5000172, printed Feb. 24, 2006.

"Dynamic Random Access Memory", Wikipedia, the free encyclopedia, pp. 1-7, http://en.wikipedia.org/wiki/Dynamic_Random_Access_Memory, printed Feb. 24, 2006.

"How Memory Works", Kingston Technology, pp. 1-8, http://www.Kingston.com/tools/umg/umg03.asp, printed Feb. 24, 2006.

Kent, Dean, "Ram Guide", Tom's Hardware, Oct. 24, 1998, pp. 1, http://www.tomshardware.com/1998/10/24/ram_guide/page2.html, printed Feb. 24, 2006.

* cited by examiner

MEMORY SYSTEM AND METHOD HAVING UNI-DIRECTIONAL DATA BUSES

CROSS-REFERENCE TO RELATED APPLICATION

This application is a continuation of U.S. patent application Ser. No. 10/928,411, filed Aug. 27, 2004 now U.S. Pat. No. 7,200,693.

FIELD OF THE INVENTION

The present invention relates to memory systems, and more particularly, to systems and methods for coupling command, address and data signals between a memory controller and one or more memory devices.

BACKGROUND OF THE INVENTION

Computer systems use memory devices, such as dynamic random access memory ("DRAM") devices, to store data that are accessed by a processor. These DRAM devices are normally used as system memory in a computer system. In a typical computer system, the processor communicates with the system memory through a processor bus and a memory controller. The system memory is typically arranged in memory modules each having multiple memory devices, and the memory modules are coupled through a memory bus to the memory controller. The processor issues a memory request, which includes a memory command, such as a read command, and an address designating the location from which data or instructions are to be read or to which data or instructions are to be written. The memory controller uses the command and address to generate appropriate command signals as well as row and column addresses, which are applied to the system memory through the memory bus. In response to the commands and addresses, data are transferred between the system memory and the processor. The memory controller is often part of a system controller, which also includes bus bridge circuitry for coupling the processor bus to an expansion bus, such as a PCI bus.

A high data bandwidth is a desirable capability of memory systems. Generally, bandwidth limitations are not related to the memory controllers since the memory controllers sequence data to and from the system memory as fast as the memory devices allow. One approach to increasing bandwidth is to increase the speed of the memory data bus coupling the memory controller to the memory devices. However, memory devices have not been able to keep up with increases in the data bandwidth of memory controllers and memory data buses. In particular, the memory controller must schedule all memory commands to the memory devices in a manner that allows the memory devices to respond to the commands. Although these hardware limitations can be reduced to some degree through the design of the memory device, a compromise must be made because reducing the hardware limitations typically adds cost, power, and/or size to the memory devices, all of which are undesirable alternatives. While memory devices can rapidly handle "well-behaved" accesses at ever increasing rates, for example, sequel traffic to the same page of a memory device, it is much more difficult for the memory devices to resolve "badly-behaved traffic," such as accesses to different pages or banks of the memory device. As a result, the increase in memory data bus bandwidth does not result in a corresponding increase in the bandwidth of the memory system.

In addition to the limited bandwidth of memory devices, the performance of computer systems is also limited by latency problems that increase the time required to read data from memory devices. More specifically, when a memory device read command is coupled to a system memory device, such as a synchronous DRAM ("SDRAM") device, the read data cannot be output from the SDRAM device until a delay of several clock periods has occurred. Although SDRAM devices can synchronously output burst data at a high data rate, the delay in initially providing the data can significantly slow the operating speed of a computer system using such SDRAM devices. These latency issues generally cannot by alleviated to any significant extent by simply increasing the memory data bus bandwidth.

The memory latency problem is greatly exacerbated by read accesses alternating with write accesses, a situation known as "read/write turnarounds." When a memory controller issues a read command to a memory device, the memory device must couple read data from a memory array to external data bus terminals of the memory device. The read data must then be coupled through a data bus portion of the memory bus from the memory device to the memory controller. It is only then that the memory controller can couple write data to the memory device through the data bus to initiate a write memory access.

Latency problems also exist for sequentially read command directed to different pages of memory cells in memory devices. If a second read is directed to a different page, the page to which the read is directed will not be an "open" page, i.e., a row of memory cells from which data was read during the previous memory access. If the row to which the read access is directed is not already open, data cannot be coupled from a memory array to the data bus terminals of the memory device until the page has been opened. Opening the page requires the coupling of memory command and a row address and a column address from the memory controller to the memory device. In response to the read address, the memory device must equilibrate the corresponding row, turn on access transistors for that row, and allow a sense amplifier for each column to sense the voltage that a respective memory cells couples to the sense amplifier. All of this can take a considerable period of time. For this reason, a read operations from a closed page and read/write turnarounds can prevent memory devices from even coming close to achieving the data bandwidths that are possible with high speed memory controllers and memory buses.

There is therefore a need for a memory device and memory system that allows a higher data bandwidth to be achieved particularly in the presence of alternating read and write accesses.

SUMMARY OF THE INVENTION

A memory system is able to achieve a high bandwidth and low latency through the use of two separate data buses coupling a memory controller to one or more memory device. A downstream bus couples write data from the memory controller to each memory device, and an upstream bus couples read data from each memory device to the memory controller. As a result, read data can be coupled from each memory device to the memory controller at the same time that write data can be coupled from the memory controller to each memory device. A single downstream memory bus may be used to couple memory commands and memory addresses to each memory device along with write data. Each memory device can include a write buffer that allows memory commands and addresses and write data for several write access to be accumulated while read requests are processed. After a number of write accesses have been accumulated, they can be processed in a burst manner without any intervening read accesses.

DETAILED DESCRIPTION

Figure 1:
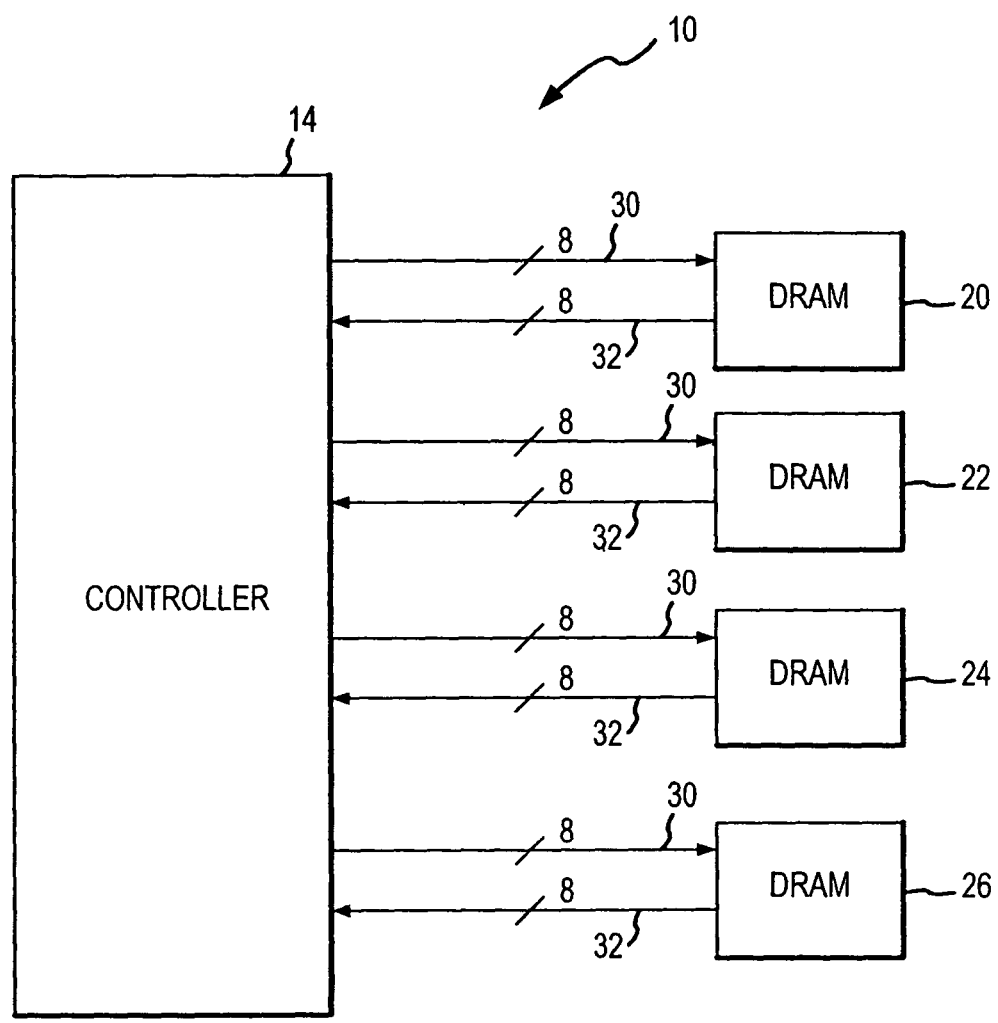
FIG. 1 is a block diagram of a memory system according to one embodiment of the invention.

A memory system 10 according to one embodiment of the invention is illustrated in FIG. 1. The memory system 10 includes a memory controller 14 coupled to the four dynamic random access memory ("DRAM") devices 20, 22, 24, 26. The memory controller 14 is coupled to each of the DRAM devices 20-26 by an 8-bit write data bus 30 and an 8-bit read data bus 32. The memory controller 14 couples memory commands and memory addresses "downstream" to the DRAM devices 20-26 through either the write data bus 30, a separate command/address bus (not shown) or separate command and address buses (not shown). If the memory commands and memory addresses are coupled through the downstream bus, the commands and addresses may be in the form of a packet, which, for write commands, may also include write data.

In operation, the memory controller 14 couples write data "downstream" to the DRAM devices 20-26 through the write data bus 30, and the DRAM devices 20-26 couple read data "upstream" to the memory controller 14 through the read data bus 32. The bandwidth of the write data bus 30 may be the same as the bandwidth of the read data bus 32. Alternatively, the write data bus 30 and the read data bus 32 may have different bandwidths to accommodate different data rates though the buses 30, 32. In the event the DRAM devices 20-26 are synchronous DRAM ("SDRAM") devices, the memory controller 14 also couples a clock signal to each of the DRAM devices 20-26. By using separate write and read data buses 30, 32, respectively, the memory controller 14 can couple write data to the DRAM devices 20-26 at the same time that the memory devices 20-26 are coupling read to the memory controller 14.

Figure 2:
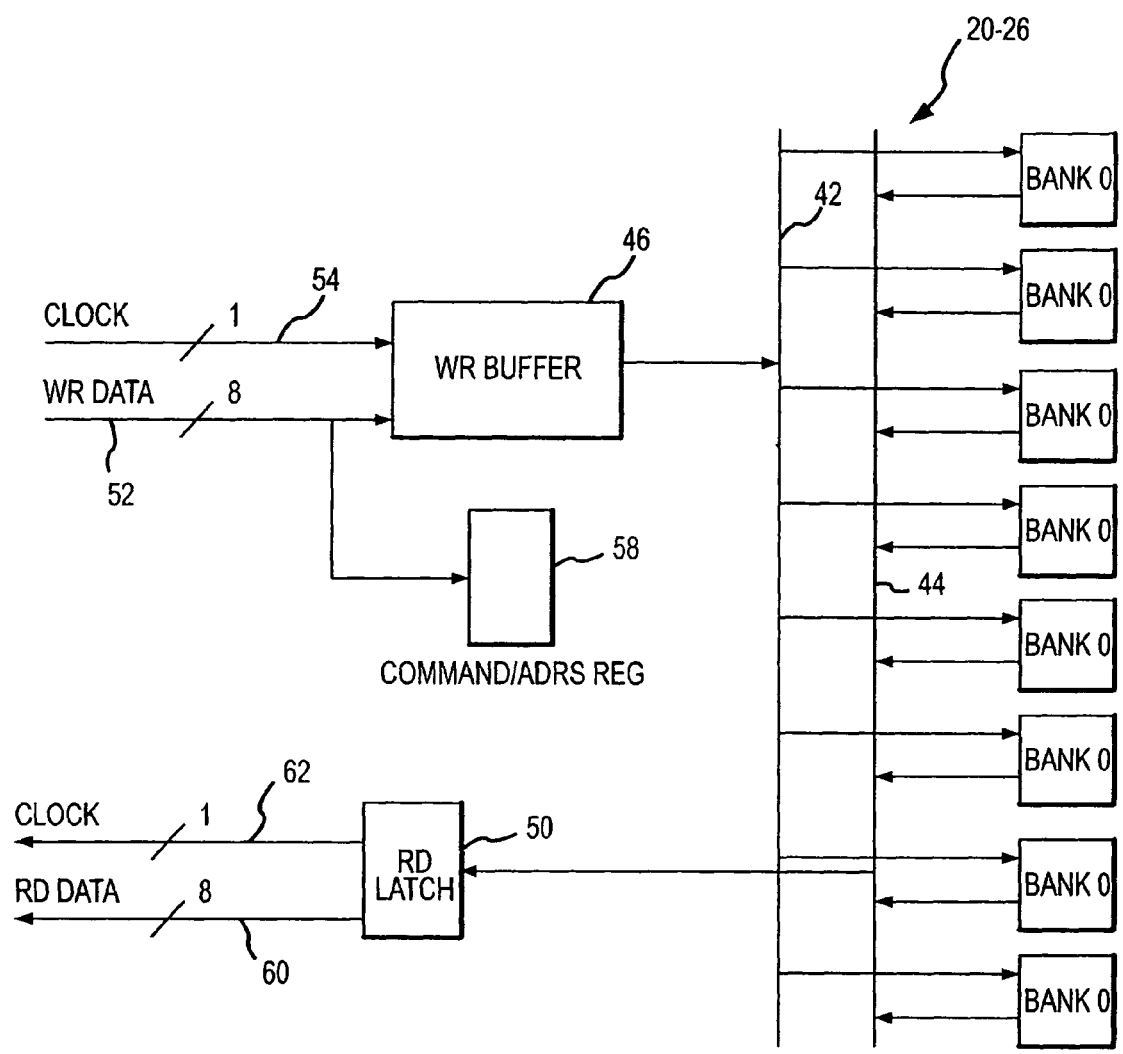
FIG. 2 is a block diagram of a dynamic random access memory devices used in the memory system of FIG. 1.

The DRAM devices 20-26 are shown in greater detail in FIG. 2. Each of the DRAM devices 20-26 includes eight memory banks 40a-h each of which are coupled to a common write data bus 42 and a common read data bus 44. The write data bus 42 receives write data from a write buffer 46, and the read data bus 44 couples read data to a read latch 50. Write data is coupled to the write buffer 46 through a write data bus 52 and is latched into the buffer 46 by a clock signal coupled through line 54. Memory commands and addresses are also coupled through the write data bus 52, and they are stored in a command/address register 58.

The read latch 50 outputs read data on an 8-bit read data bus 60 in synchronism with a clock signal that is also coupled from the read latch 50 on line 62. The memory devices 20-26 include a large number of other conventional memory device components, but these have been omitted from FIG. 2 in the interest of brevity and clarity.

In operation, memory commands, such as write commands and read commands, as well as memory addresses are coupled through the write data bus 52. The memory commands and addresses are stored in the command/address register 58. The write data also coupled through the write data bus 52 and stored in the write buffer 46. In response to a read command coupled to the command/address register 58, the memory devices 20-26 output read data, which are coupled to the read latch 50. The read latch 50 stores the read data until the read data bus 60 and memory controller 14 (FIG. 1) are able to receive the read data. The read data are then clocked out of the read latch 50 through the read data bus 60. The read memory accesses are preferably given priority over write memory accesses so that a number of write commands and associated addresses are stored in the command/address register 58 while the write data are accumulated in the write buffer 46. When a sufficient number of write accesses have been accumulated, they are processed sequentially without any intervening read accesses. As a result, the latency penalties inherent in read/write turnarounds are avoided. Although it is not possible for write data to be coupled to one of the banks 40a-h at the same time read data is being coupled from the same bank, it is possible for write data to be coupled to one of the banks 40a-h at the same time read data is being coupled from another of the banks 40a-h. Thus, by using separate write and read data buses 30, 32, respectively, the memory controller 14 can couple write data to each of the DRAM devices 20-26 at the same time that the respective memory device 20-26 is coupling read data to the memory controller 14. By allowing a read command to be coupled through the write data bus 52 and stored in the command/address register 58, read commands can be coupled to the memory devices 20-26 during write or read operation. As a result, the latency for read operations is minimized. Otherwise, it would be necessary to wait for a write operation to be completed before a read command could be sent.

In one embodiment of the invention, the memory controller 14 (FIG. 1) simply issues read and write memory commands and addresses to the memory devices 20-26. The memory commands are stored in the command/address register 58 until the memory devices 20-26 are able to process them. The commands are then processed by each of the memory devices 20-26, and this processing includes coupling a read response or a write response to the controller through the read data bus 60. The read responses and write responses indicate to the memory controller 14 that processing of a corresponding memory request has been completed. The responses uniquely identify the memory request corresponding to the response so that it is not necessary for the memory controller 14 to keep track of the memory requests, and the memory requests may be processed out-of-order. In the case of a read response, the read response may also include the read data resulting from the corresponding read request.

Figure 3:
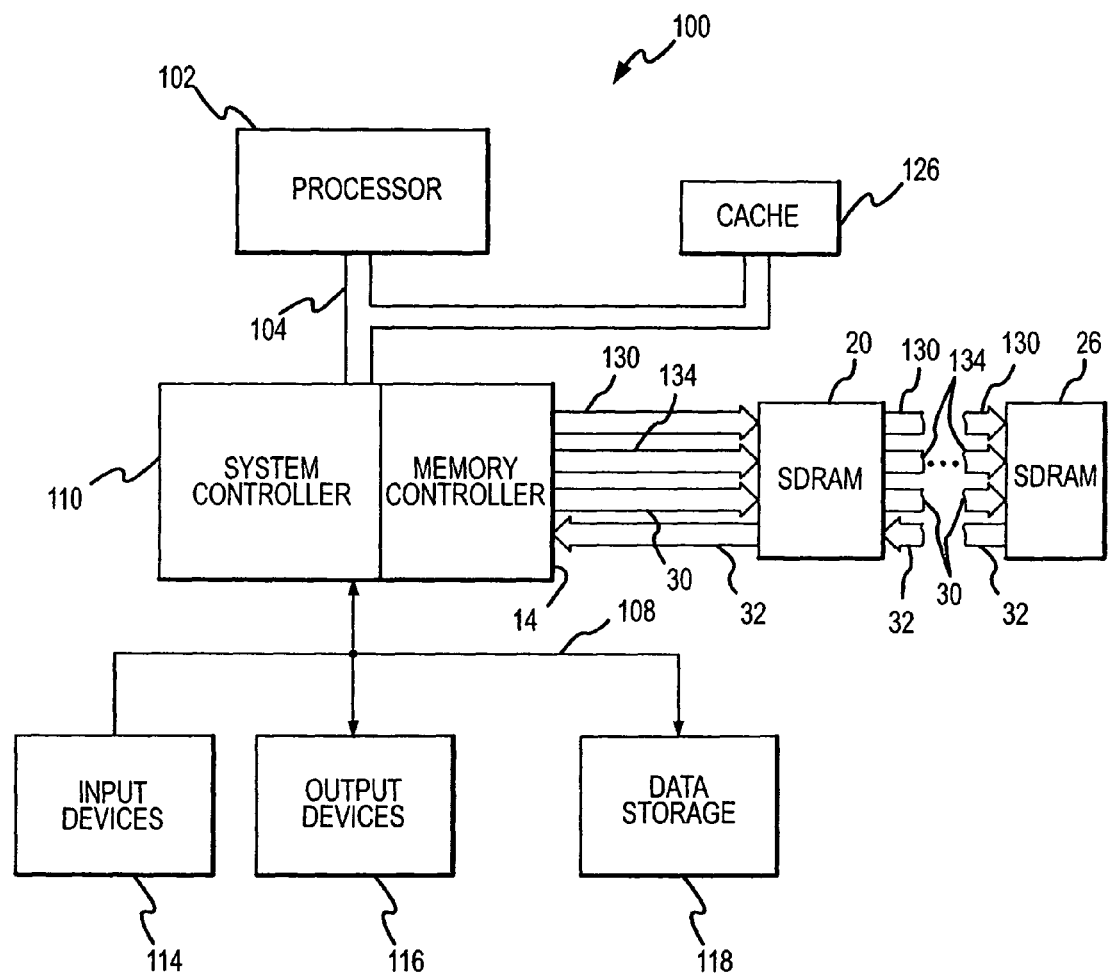
FIG. 3 is a block diagram of a computer system using the memory system of FIG. 1.

A computer system 100 using the memory system 10 of FIG. 1 is shown in FIG. 3. The computer system 100 includes a processor 102 for performing various computing functions, such as executing specific software for performing specific calculations or tasks. The processor 102 includes a processor bus 104 that normally includes an address bus, a control bus, and a data bus. The processor buss is coupled to an expansion bus 108, such as a peripheral component interconnect ("PCI") bus, through a system controller 110. The computer system 100 includes one or more input devices 114, such as a keyboard or a mouse, coupled to the processor 102 through the expansion bus 108, system controller 110 and processor bus 104 to allow an operator to interface with the computer system 100. Typically, the computer system 100 also includes one or more output devices 116 coupled to the expansion bus 108, such output devices typically being a printer or a video terminal. One or more mass data storage devices 118 are also typically coupled to the expansion bus 108 to store data or retrieve data from external storage media (not shown). Examples of typical mass data storage devices 118 include hard and floppy disks, tape cassettes, and compact disk read-only memories (CD-ROMs). The processor 102 is also typically coupled to a cache memory 126, which is usually static random access memory ("SRAM"). As mentioned above, the computer system 100 also includes the memory system 10 of FIG. 1. Specifically, the system controller 110 includes the memory controller 14, which, as explained above with reference to FIG. 1, is coupled to several DRAM devices 20-26. The memory controller 14 is coupled to each of the DRAM devices 20-26 through the write data bus 30 and the read data bus 32 as well as a command bus 130 and an address bus 134.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A method of coupling data between a memory controller and a memory device, comprising:
    coupling write data from the memory controller to the memory device through a first unidirectional data bus;
    coupling read data from the memory device to the memory controller through a second unidirectional data bus that is separate and isolated from the first unidirectional data bus;
    retaining the write data in the memory device for a plurality of write requests without coupling the write data to an array of memory cells;
    waiting until the memory device is not coupling read data from the array of memory cells; and
    when the memory device is not coupling read data from the array of memory cells, coupling the retained write data to the array of memory cells.

2. The method of claim 1 wherein the act of coupling the retained write data to the array of memory cells comprises coupling the retained write data to the array of memory cells responsive to a predetermined memory command received by the memory device.

3. The method of claim 2 wherein the predetermined memory command comprises a column address strobe command.

4. The method of claim 1 wherein the memory device comprises a dynamic random access memory device.

5. The method of claim 1, further comprising coupling memory commands from the memory controller to the memory device through the first unidirectional data bus.

6. The method of claim 5, further comprising:
    retaining the memory commands in the memory device for a plurality of memory requests without processing the memory commands;
    waiting until the memory device is not coupling read data from the array of memory cells; and
    when the memory device is not coupling read data from the array of memory cells, processing the retained memory commands.

7. The method of claim 5, further comprising coupling responses to the memory commands from the memory device to the memory controller through the second unidirectional data bus.

8. The method of claim 7 wherein the responses to the memory command comprises read responses to read commands and write responses to write commands, and wherein the read responses include the read data.

9. The method of claim 1, further comprising coupling memory addresses from the memory controller to the memory device through the first unidirectional data bus.

10. The method of claim 1 wherein the memory device comprises a plurality of memory banks, and wherein the method further comprises coupling write data from the first unidirectional data bus to one of the memory banks at the same time that read data are being coupled from another of the memory banks to the second unidirectional data bus.

11. A method of coupling data between a memory requester and a memory device, comprising:
    coupling write data from the memory requester to the memory device through a first bus;
    coupling read data from the memory device to the memory requester through a second bus that is separate and isolated from the first bus;
    retaining the write data in the memory device for a plurality of write requests without coupling the write data to an array of memory cells;
    waiting until the memory device is not coupling read data from the array of memory cells; and
    when the memory device is not coupling read data from the array of memory cells, coupling the retained write data to the array of memory cells.

12. The method of claim 11 wherein the act of coupling the retained write data to the array of memory cells comprises coupling the retained write data to the array of memory cells responsive to a predetermined memory command received by the memory device.

13. The method of claim 12 wherein the predetermined memory command comprises a column address strobe command.

14. The method of claim 11, further comprising coupling memory commands from the memory requester to the memory device through the first bus.

15. The method of claim 14, further comprising:
    retaining the memory commands in the memory device for a plurality of memory requests without processing the memory commands;
    waiting until the memory device is not coupling read data from the array of memory cells; and
    when the memory device is not coupling read data from the array of memory cells, processing the retained memory commands.

16. The method of claim 14, further comprising coupling responses to the memory commands from the memory device to the memory requester through the second bus.

17. The method of claim 16 wherein the responses to the memory command comprises read responses to read commands and write responses to write commands, and wherein the read responses include the read data.

18. The method of claim 11, further comprising coupling memory addresses from the memory requester to the memory device through the first bus.

19. The method of claim 11 wherein the memory device comprises a plurality of memory banks, and wherein the method further comprises coupling write data from the first bus to one of the memory banks at the same time that read data are being coupled from another of the memory banks to the second bus.

20. A method of coupling data to and from a memory device, comprising:
    coupling write data from the memory requester to the memory device through a first set of terminals of the memory device;

coupling read data from the memory device through a second set of terminals that are separate and isolated from the first set of terminals;

retaining the write data in the memory device for a plurality of write requests without coupling the write data to an array of memory cells;

waiting until the memory device is not coupling read data from the array of memory cells; and when the memory device is not coupling read data from the array of memory cells, coupling the retained write data to the array of memory cells.

21. The method of claim 20, further comprising:

coupling memory commands to the memory device through the first set of terminals;

retaining the memory commands in the memory device for a plurality of memory requests without processing the memory commands;

waiting until the memory device is not coupling read data from the array of memory cells; and when the memory device is not coupling read data from the array of memory cells, processing the retained memory commands.

22. The method of claim 20 wherein the memory device comprises a plurality of memory banks, and wherein the method further comprises coupling write data from the first set of terminals to one of the memory banks at the same time that read data are being coupled from another of the memory banks to the second set of terminal.

23. A method of coupling data between a memory controller and a memory device, comprising:

coupling write data from the memory controller to the memory device through a first unidirectional data bus;

coupling read data from the memory device to the memory controller through a second unidirectional data bus that is separate and isolated from the first unidirectional data bus;

coupling memory commands from the memory controller to the memory device through the first unidirectional data bus;

retaining the memory commands in the memory device for a plurality of memory requests without processing the memory commands;

waiting until the memory device is not coupling read data from the memory device; and when the memory device is not coupling read data from the memory device, processing the retained memory commands.

24. A method of coupling data between a memory requester and a memory device, comprising:

coupling write data from the memory requester to the memory device through a first bus;

coupling read data from the memory device to the memory requester through a second bus that is separate and isolated from the first bus;

coupling memory commands from the memory requester to the memory device through the first bus;

retaining the memory commands in the memory device for a plurality of memory requests without processing the memory commands;

waiting until the memory device is not coupling read data from memory device; and when the memory device is not coupling read data from the memory device, processing the retained memory commands.

25. A method of coupling data to and from a memory device, comprising:

coupling write data to the memory device through a first set of terminals of the memory device;

coupling read data from the memory device through a second set of terminals that are separate and isolated from the first set of terminals;

coupling memory commands to the memory device through the first set of terminals;

retaining the memory commands in the memory device for a plurality of memory requests without processing the memory commands;

waiting until the memory device is not coupling read data from the memory device; and when the memory device is not coupling read data from the memory device, processing the retained memory commands.

* * * * *